(12) United States Patent
Kumazaki et al.

(10) Patent No.: US 9,196,375 B2
(45) Date of Patent: Nov. 24, 2015

(54) SEMICONDUCTOR STORAGE DEVICE

(71) Applicant: Kabushiki Kaisha Toshiba, Minato-ku (JP)

(72) Inventors: Noriyasu Kumazaki, Kawasaki (JP); Masahiro Yoshihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/084,898

(22) Filed: Nov. 20, 2013

(65) Prior Publication Data

US 2015/0009763 A1    Jan. 8, 2015

Related U.S. Application Data

(60) Provisional application No. 61/843,242, filed on Jul. 5, 2013.

(51) Int. Cl.
*G11C 16/30* (2006.01)
*G11C 16/04* (2006.01)
*G11C 16/28* (2006.01)

(52) U.S. Cl.
CPC ............ *G11C 16/30* (2013.01); *G11C 16/0483* (2013.01); *G11C 16/28* (2013.01)

(58) Field of Classification Search
CPC ..... G11C 16/30; G11C 16/0483; G11C 16/28
USPC ................. 365/63, 51, 226, 189.08
See application file for complete search history.

(56) References Cited

U.S. PATENT DOCUMENTS

| | | | | |
|---|---|---|---|---|
| 5,321,646 A | * | 6/1994 | Tomishima et al. | 365/51 |
| 5,426,615 A | * | 6/1995 | Tomishima et al. | 365/226 |
| 5,675,538 A | | 10/1997 | Park et al. | |
| 5,687,108 A | * | 11/1997 | Proebsting | 365/51 |
| 5,699,289 A | * | 12/1997 | Takenaka | 365/51 |
| 5,724,293 A | * | 3/1998 | Tomishima et al. | 365/207 |
| 5,815,454 A | * | 9/1998 | Tomishima et al. | 365/226 |
| 5,867,440 A | * | 2/1999 | Hidaka | 365/226 |
| 6,064,621 A | * | 5/2000 | Tanizaki et al. | 365/230.03 |
| 6,104,630 A | * | 8/2000 | Hidaka | 365/63 |
| 6,229,753 B1 | * | 5/2001 | Kono et al. | 365/230.03 |
| 6,351,179 B1 | | 2/2002 | Ikehashi et al. | |
| 6,385,115 B1 | * | 5/2002 | Nakai | 365/226 |
| 6,411,160 B1 | | 6/2002 | Riho et al. | |

(Continued)

FOREIGN PATENT DOCUMENTS

| | | |
|---|---|---|
| JP | 8-227587 | 9/1996 |
| JP | 2000-58761 | 2/2000 |

(Continued)

*Primary Examiner* — Viet Q Nguyen
(74) *Attorney, Agent, or Firm* — Oblon, McClelland, Maier & Neustadt, L.L.P.

(57) ABSTRACT

A semiconductor storage device according to the present embodiment includes a memory cell array including a plurality of memory cells. A plurality of word lines are electrically connected to control gates of the memory cells. A plurality of bit lines are electrically connected to one end of a current path of the memory cells. A sense amplifier part detects data stored in the selected memory cells. A power supply part converts an external power supply voltage to an internal power supply voltage and supplies the internal power supply voltage to the sense amplifier part. A power supply wire extends above the memory cell array and is provided to range from the power supply part to the sense amplifier part.

18 Claims, 5 Drawing Sheets

(56) References Cited

U.S. PATENT DOCUMENTS

| | | | |
|---|---|---|---|
| 6,483,763 B2 * | 11/2002 | Uchikoba et al. | 365/205 |
| 6,518,835 B2 | 2/2003 | Riho et al. | |
| 6,590,444 B2 | 7/2003 | Ikehashi et al. | |
| 6,801,060 B2 | 10/2004 | Ikehashi et al. | |
| 6,804,154 B2 * | 10/2004 | Kitagawa et al. | 365/189.09 |
| 7,075,849 B2 * | 7/2006 | Chang et al. | 365/226 |
| 7,242,602 B2 * | 7/2007 | Lee et al. | 365/69 |
| 7,250,811 B2 | 7/2007 | Kim | |
| 7,283,412 B2 * | 10/2007 | Do | 365/205 |
| 7,630,223 B2 * | 12/2009 | Chae | 365/63 |
| 7,630,233 B2 * | 12/2009 | Kato et al. | 365/163 |
| 8,213,252 B2 * | 7/2012 | Kim | 365/207 |
| 8,451,669 B2 * | 5/2013 | Chen et al. | 365/189.11 |
| 2002/0079956 A1 | 6/2002 | Ikehashi et al. | |
| 2002/0130714 A1 | 9/2002 | Riho et al. | |
| 2003/0006832 A1 | 1/2003 | Ikehashi et al. | |
| 2003/0218497 A1 | 11/2003 | Ikehashi et al. | |
| 2006/0091938 A1 | 5/2006 | Kim | |

FOREIGN PATENT DOCUMENTS

| | | |
|---|---|---|
| JP | 2000-77623 | 3/2000 |
| JP | 2006-127727 | 5/2006 |
| JP | 3802239 | 5/2006 |
| JP | 4079522 | 2/2008 |
| JP | 2011-181157 | 9/2011 |

* cited by examiner

SEMICONDUCTOR STORAGE DEVICE

CROSS REFERENCE TO RELATED APPLICATIONS

This application is based upon and claims the benefit of priority from the prior U.S. Patent Application No. 61/843,242 filed on Jul. 5, 2013, the entire contents of which are incorporated herein by reference.

FIELD

The embodiments of the present invention relate to a semiconductor storage device.

BACKGROUND

As large-capacity non-volatile memory, NAND-type flash memory has been widely known.

DETAILED DESCRIPTION

Embodiments will now be explained with reference to the accompanying drawings. The present invention is not limited to the embodiments.

A semiconductor storage device according to the present embodiment includes a memory cell array including a plurality of memory cells. A plurality of word lines are electrically connected to control gates of the memory cells. A plurality of bit lines are electrically connected to one end of a current path of the memory cells. A sense amplifier unit detects data stored in the selected memory cells. A power supply part converts an external power supply voltage to an internal power supply voltage and supplies the internal power supply voltage to the sense amplifier part. A power supply wire extends above the memory cell array and is provided to range from the power supply part to the sense amplifier part.

The following embodiments are applicable to internal power supplies of various types of memories. A NAND flash memory is described below as an example.

Components with substantially the same functionalities and configurations will be referred to with the same reference number and duplicate descriptions will be made only when required. Note that figures are schematic and the relationship between the thickness and the plane dimension of a film and the ratios of the thickness of one layer to another may differ from actual values. Therefore, it should be noted that a specific thickness and dimension should be determined in accordance with the following description. Moreover, it is natural that different figures may contain a component different in dimension and/or ratio.

(First Embodiment)

Figure 1:
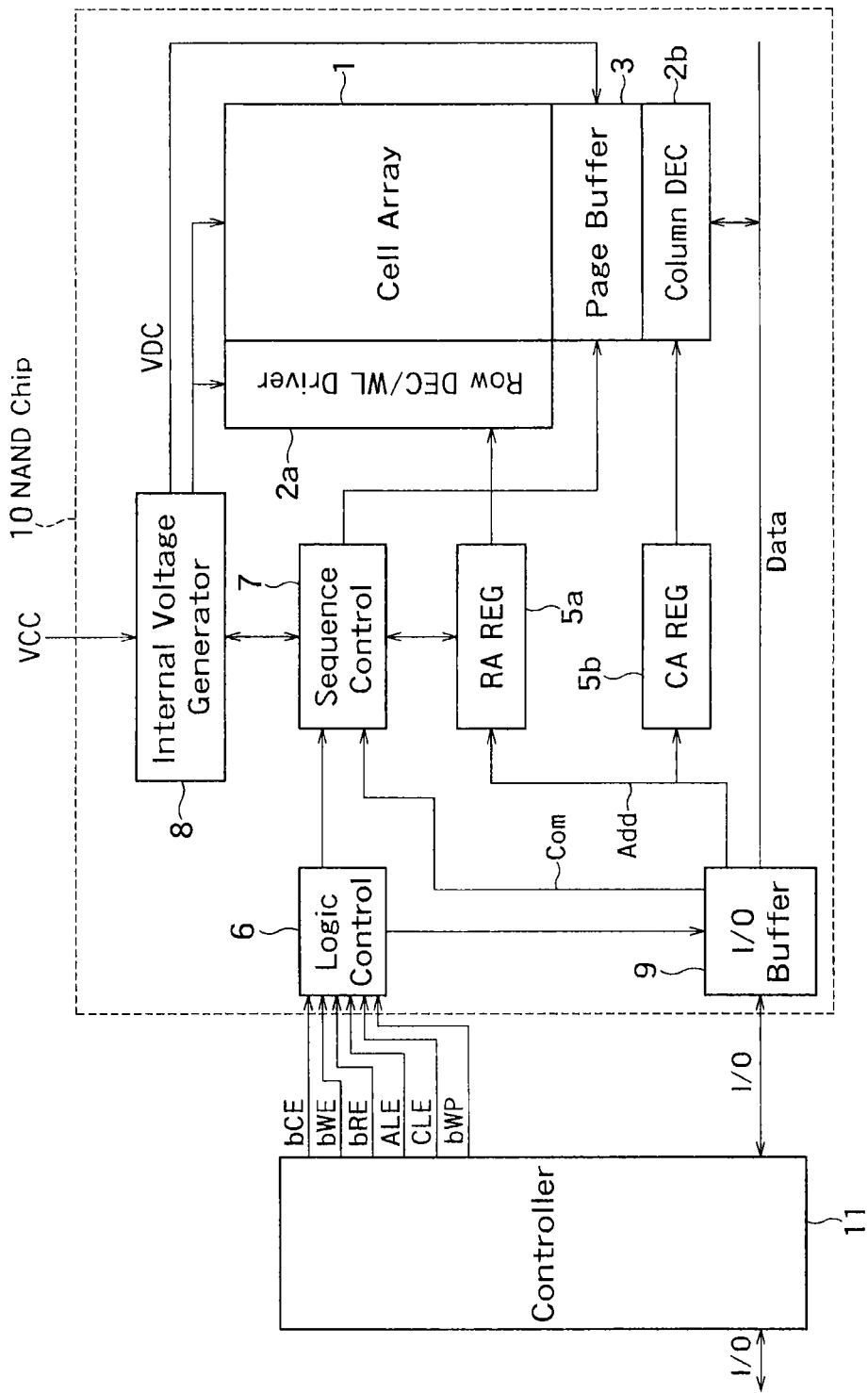
FIG. 1 is a block diagram showing an example of a configuration of a NAND flash memory according to a first embodiment.

FIG. 1 is a block diagram showing an example of a configuration of a NAND flash memory according to a first embodiment. The NAND flash memory according to the first embodiment includes a NAND chip 10 and a controller 11 that controls the NAND chip 10. The NAND chip 10 and the controller 11 can be sealed with resin into one package as a multi-chip package (MCP).

Each of memory cell arrays 1 constituting the NAND chip 10 is configured by two-dimensionally arraying a plurality of memory cells MC in a matrix. Each of these memory cells MC includes a charge accumulation layer. This memory cell MC is not limited to an FG-type memory cell but can be a MONOS-type memory cell, for example. A row decoder/word line driver 2a, a column decoder 2b, a page buffer 3, and an internal voltage generator 8 constitute a data write/read circuit that writes and reads data to and from the memory cell array 1 in units of pages. The row decoder/word line driver 2a selectively drives word lines of the memory cell array 1. The page buffer 3 includes sense amplifier circuits and data holding circuits corresponding to one page and reads and writes data from and to the memory cells MC on one page of the memory cell array 1.

Columns of the memory cells MC on one page that store the data read by the page buffer 3 are sequentially selected by the column decoder 2b and the read data is output to an external I/O terminal via an I/O buffer 9. Write data supplied from the I/O terminal is selected by the column decoder 2b and loaded to the page buffer 3. The write data to be written to one page is loaded to the page buffer 3. Row address signals and column address signals are input to the NAND chip 10 via the I/O buffer 9 and transferred to the row decoder/word line driver 2a and the column decoder 2b, respectively. A row address register 5a holds a to-be-erased block address during an erasing operation and holds a page address during a write or read operation. An initial column address used to load the write data before starting the write operation or an initial column address for the read operation is input to a column address register 5b. The column address register 5b holds the input column address until a write enable signal bWE or a read enable signal bRE is toggled in predetermined conditions.

A logic control circuit 6 controls input of commands or addresses and also controls input/output of data based on a control signal such as a chip enable signal bCE, a command enable signal CLE, an address latch enable signal ALE, the write enable signal bWE and the read enable signal bRE. A sequence control circuit 7 executes a read sequence control, a write sequence control or an erase sequence control upon receiving a command. An internal voltage generator 8 receives an external power supply voltage VCC and generates predetermined voltages necessary for various operations under control of the sequence control circuit 7. An internal power supply voltage VDC for sense amplifiers (described later) is generated by the internal voltage generator 8.

The controller 11 executes a data write control and a data read control in conditions suited for the present write state of the NAND chip 10. Needless to mention, the NAND chip 10 can execute a part of the data read control.

Figure 2:
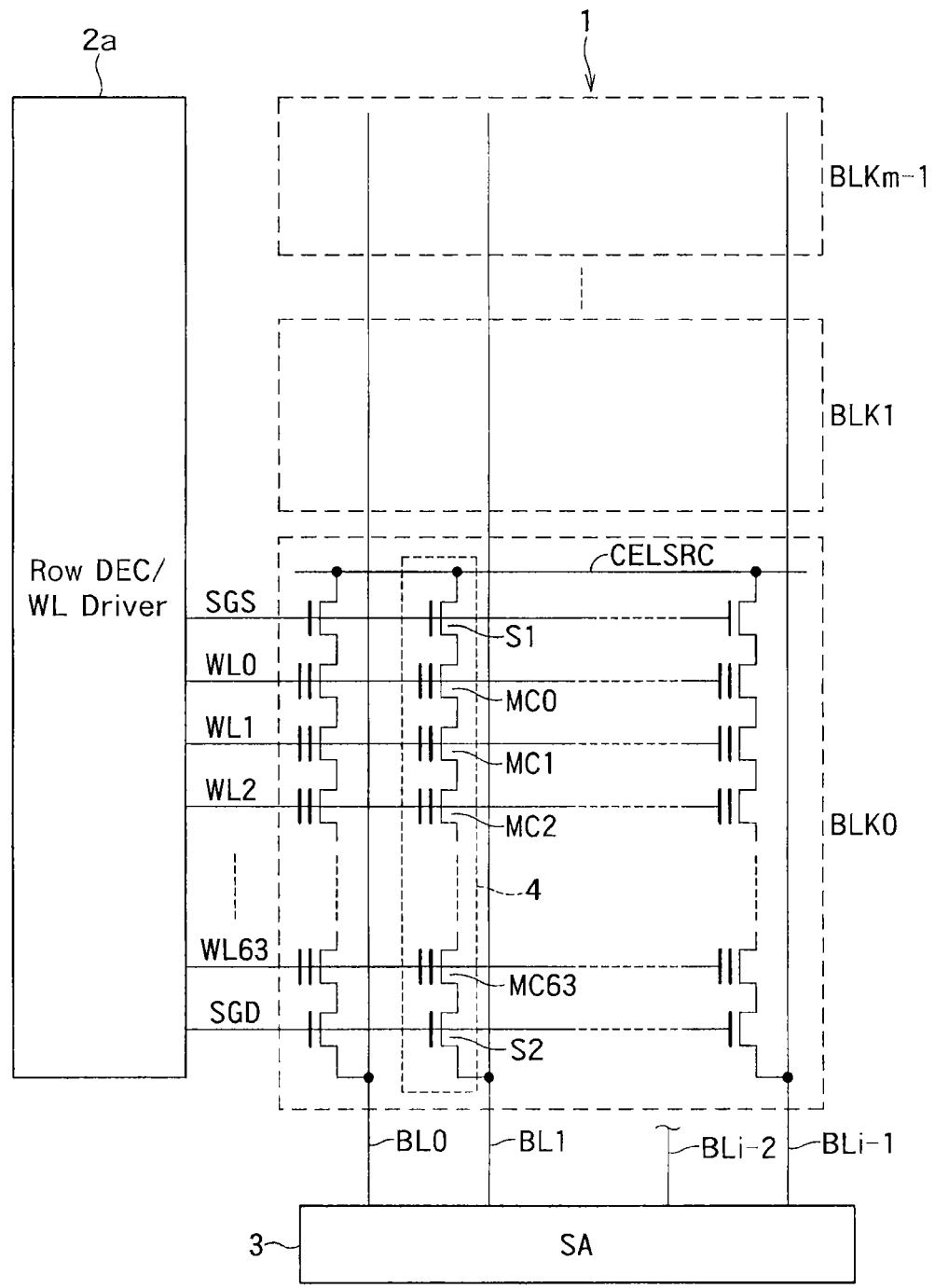
FIG. 2 shows an example of a specific configuration of the memory cell array 1.

FIG. 2 shows an example of a specific configuration of the memory cell array 1. In this example, NAND cell units (a NAND strings) 4 are, respectively, constituted by 64 memory cells MC0 to MC63 connected in series and selection gate transistors S1 and S2 connected to both ends of the series-connected memory cells MC0 to MC63. A source of the selection gate transistor S1 is connected to a common source line CELSRC and a drain of the selection gate transistor S2 is connected to one bit line BL (one of BL0 to BLi-1). That is, each bit line BL is connected to one end of a current path of the memory cells MC. Control gates of the memory cells MC0 to MC63 are connected to word lines WL (WL0 to WL63), respectively, and gates of the selection gate transistors S1 and S2 are connected to selection gate lines SGS and SGD, respectively.

A range of a plurality of memory cells MC along one word line WL defines one page that is a collective data read and write unit. A range of a plurality of NAND cell units 4 aligned in a word line WL direction constitutes one cell block BLK that is a collective data erasing unit. In FIG. 2, the memory cell array 1 is constituted by arraying a plurality of cell blocks BLK0 to BLKm-1 that share the bit lines BL in a bit line BL direction. The word lines WL and the selection gate lines SGS and SGD are driven by the row decoder/word line driver 2a. Each bit line BL is connected to one sense amplifier circuit SA included in the page buffer 3. The sense amplifier circuit SA detects data stored in the memory cells MC selected by the bit line BL and the word lines WL.

Figure 3:
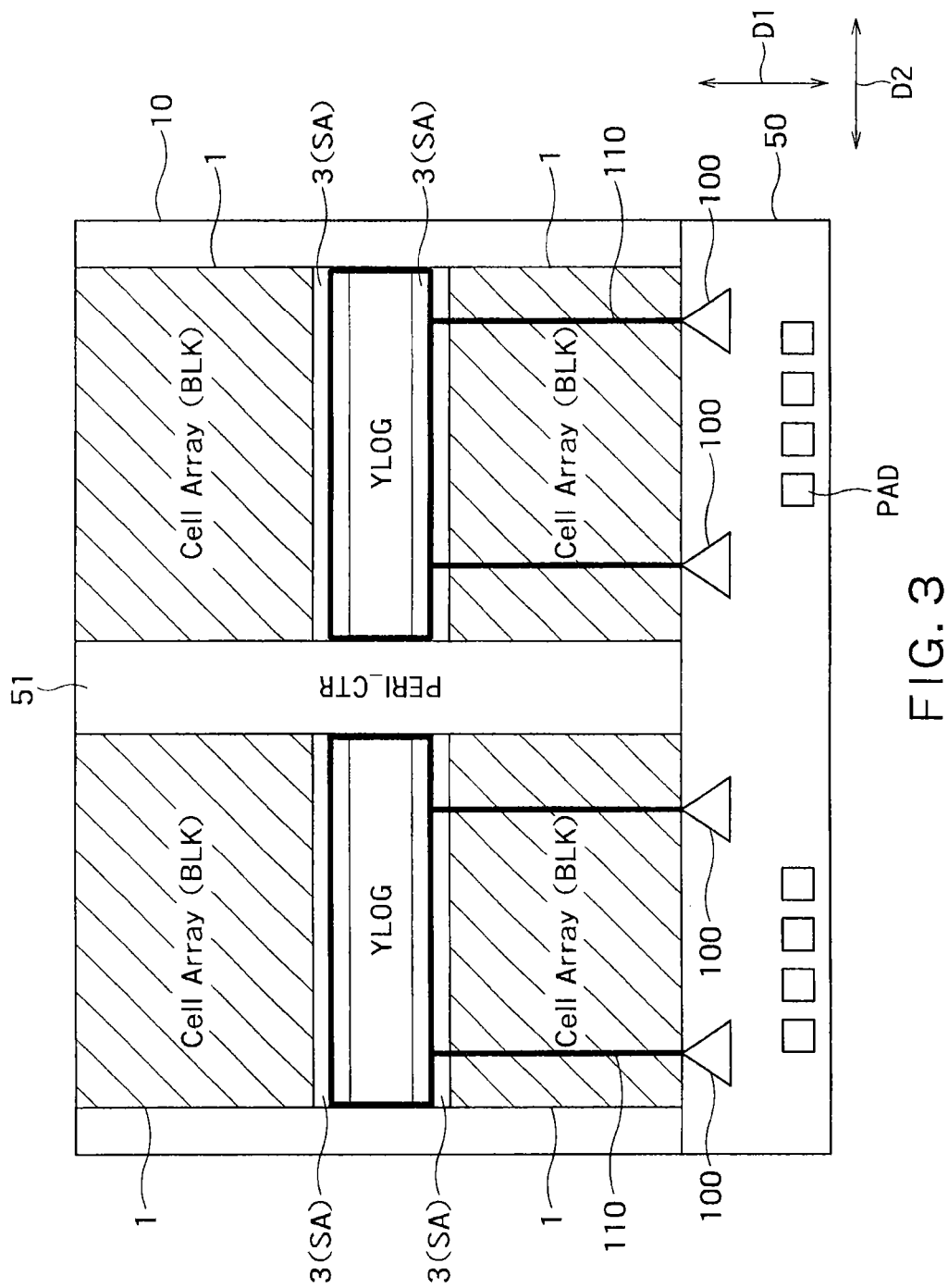
FIG. 3 shows an example of a chip layout of the NAND flash memory according to the first embodiment.

FIG. 3 shows an example of a chip layout of the NAND flash memory according to the first embodiment. In FIG. 3, the four memory cell arrays (or cell blocks BLK) 1 are arranged. Peripheral circuits 50 are arranged around (end portions in a D1 direction of FIG. 3 of) the memory cell arrays 1. A pericenter 51 is arranged as a part of the peripheral circuits 50 between the two memory cell arrays 1 adjacent in a D2 direction of FIG. 3. The sense amplifier circuits SA and logic circuits YLOG are arranged between the two memory cell arrays 1 adjacent in the D1 direction of FIG. 3. The logic circuits YLOG are logic circuits provided to control the sense amplifier circuits SA, respectively. The sense amplifier circuits SA and the logic circuits YLOG are included in the page buffer 3 shown in FIG. 1.

Various logic circuits are provided in the peripheral circuits 50 so as to control the memory cell arrays 1. The peripheral circuits 50 also include power supply circuits 100 and external power supply pads PAD. These power supply circuits 100 are, for example, power supply circuits for the sense amplifiers. The power supply circuits 100 are included in the internal voltage generator 8 of FIG. 1.

The power supply circuits 100 convert (drop) an external power supply voltage VCC obtained from the external power supply pads PAD to a desired internal power supply voltage VDC.

The power supply circuits 100 supply the internal power supply voltage VDC to the sense amplifier circuits SA and/or the logic circuits YLOG. To transfer the internal power supply voltage VDC from each power supply circuit 100 to the sense amplifier circuits SA, a power supply wire 110 is provided between the power supply circuit 100 and the sense amplifier circuits SA. As shown in FIG. 3, the power supply wire 110 is arranged to extend above the memory cell array 1 and to range from the power supply circuit 100 to the sense amplifier circuits SA. It suffices to incorporate the power supply circuits 100 in the internal voltage generator 8 (see FIG. 1) included in the peripheral circuits 50.

Figure 4:
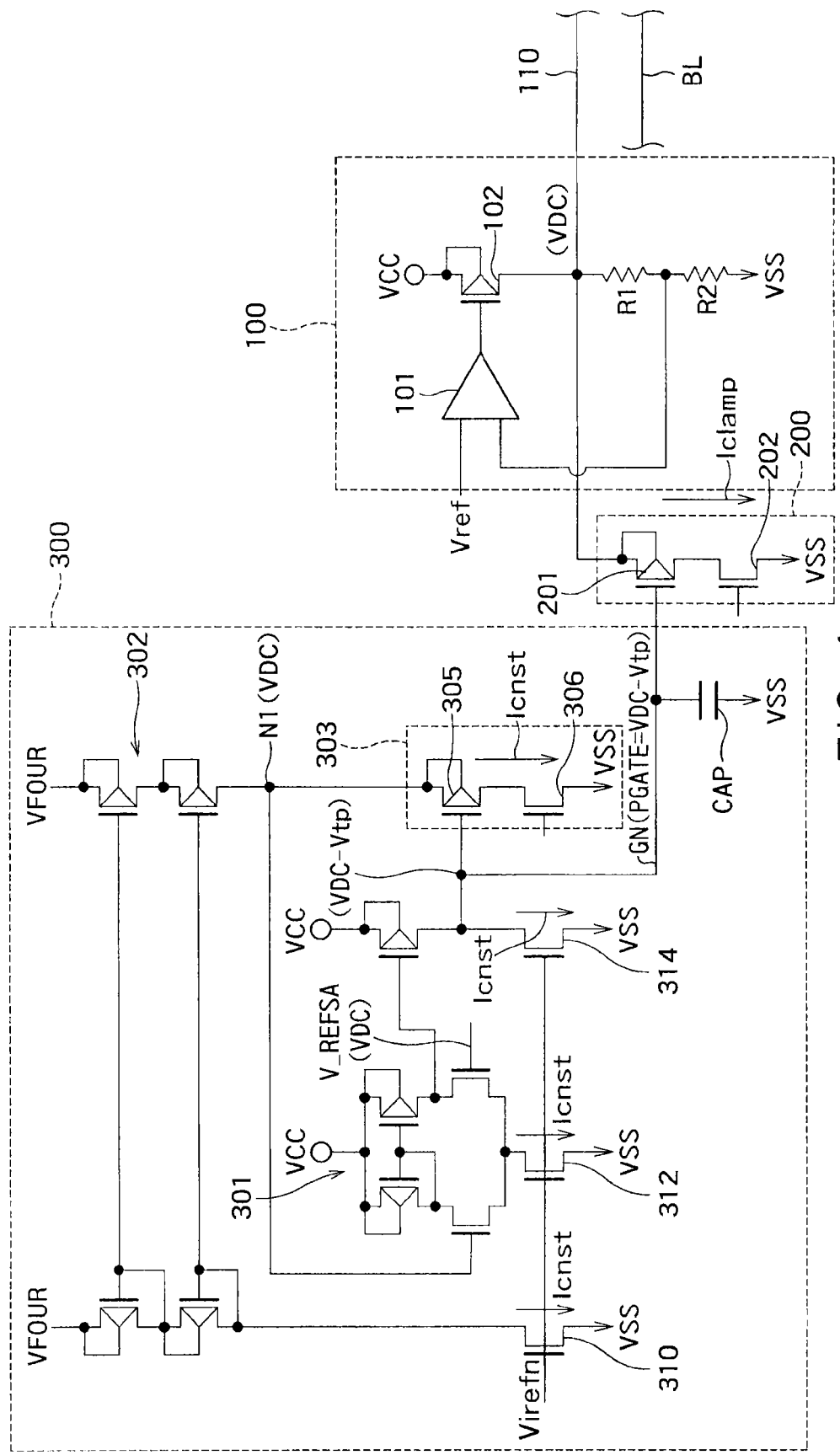
FIG. 4 is a circuit diagram showing an example of configurations of the power supply circuit 100, a discharge circuit 200, and a gate voltage generation circuit 300 according to the first embodiment.

FIG. 4 is a circuit diagram showing an example of configurations of the power supply circuit 100, a discharge circuit 200, and a gate voltage generator 300 according to the first embodiment. The discharge circuit 200 and the gate voltage generator 300 as well as the power supply circuit 100 can be incorporated in the internal voltage generator 8. As described above, the power supply wire 110 extends above the memory cell array 1 and the bit lines BL in an extending direction of the bit lines BL. Therefore, in FIG. 4, the power supply wire 110 is displayed in parallel to one bit line BL.

The power supply circuit 100 is connected between the power supply wire 110 and the discharge circuit 200. The power supply circuit 100 includes an operational amplifier 101, a P-type transistor 102, and resistors R1 and R2. A source and a substrate (a body) of the P-type transistor 102 are commonly connected to the external power supply voltage VCC. A drain of the P-type transistor 102 is connected to the internal power supply voltage VDC. One end of the resistor R1 is connected to the power supply wire 110 and the other end of the resistor R1 is connected to one end of the resistor R2. The other end of the resistor R2 is connected to a standard voltage (a ground potential, for example) VSS. That is, the P-type transistor 102 and the resistors R1 and R2 are connected in series between the external power supply voltage VCC and the standard voltage VSS.

A gate of the P-type transistor 102 is connected to an output of the operational amplifier 101. Two inputs of the operational amplifier 101 are connected to a reference voltage Vref and a level obtained by dividing the resistance of the power supply wire 110, respectively. The operational amplifier 101 thereby controls the P-type transistor 102 so that a voltage of the power supply wire 110 is a constant value determined by the reference voltage Vref and a ratio of the resistors R1 and R2. The operational amplifier 101 thereby generates a desired voltage VDC for the sense amplifier.

In this way, the power supply circuit 100 converts (drops) the external power supply voltage VCC to the internal power supply voltage VDC and transfers the internal power supply voltage VDC to the power supply wire 110.

The discharge circuit 200 is connected to the power supply wire 110 and arranged near the power supply circuit 100. The discharge circuit 200 includes a P-type transistor 201 and an N-type transistor 202.

A source and a substrate (a body) of the P-type transistor 201 serving as a clamp transistor are commonly connected to the power supply wire 110. A drain of the P-type transistor 201 is connected to a drain of the N-type transistor 202. A source of the N-type transistor 202 is connected to the standard voltage (a ground potential, for example) VSS. That is, the P-type transistor 201 and the N-type transistor 202 are connected in series between the power supply wire 110 and the standard voltage VSS.

A gate (hereinafter, also "gate node GN") of the P-type transistor 201 is connected to the gate voltage generator 300. The gate voltage generator 300 holds a gate voltage of the P-type transistor 201 (voltage of the gate node GN) to be a predetermined voltage PGATE. The P-type transistor 201 is thereby turned on when the voltage of the power supply wire 110 exceeds the predetermined voltage PGATE by a threshold voltage Vtp of the P-type transistor 201. The P-type transistor 201 flows a current Iclamp from the power supply wire 110 to the standard voltage VSS by being turned on. The voltage of the power supply wire 110 can be thereby kept to be equal to or lower than the internal power supply voltage VDC that is set as an upper limit. To set the upper limit of the voltage of the power supply wire 110 to the internal power supply voltage VDC, it suffices that the predetermined voltage PGATE is set to a voltage (VDC-Vtp) obtained by subtracting the threshold voltage Vtp of the P-type transistor 201 from the internal power supply voltage VDC.

The N-type transistor 202 is a switching transistor that is turned on when the internal power supply voltage VDC is supplied to the power supply wire 110. The N-type transistor 202 is not necessarily always turned on when the internal power supply voltage VDC is supplied to the power supply wire 110 but the N-type transistor 202 can be turned on only when clamping the power supply wire 110.

The gate voltage generator 300 includes a differential circuit 301, a current mirror circuit 302, and a replica circuit 303. A reference voltage V_REFSA is input to the differential circuit 301, and the differential circuit 301 operates so that a voltage of a node N1 is equal to the reference voltage V_REFSA. In the first embodiment, the reference voltage V_REFSA is set to be equal to the internal power supply voltage VDC. Therefore, the voltage of the node N1 between the current mirror circuit 302 and the replica circuit 303 is also controlled to be equal to the internal power supply voltage VDC.

A reference voltage Virefn is commonly applied to gates of transistors 310, 312, and 314. A constant current Icnst thereby flows across the transistors 310, 312, and 314. Furthermore, the current mirror circuit 302 flows a current substantially equal to the constant current Icnst flowing across the transistor 310 to the replica circuit 303 using a high-level voltage VFOUR. The high-level voltage VFOUR is a voltage obtained by boosting the external power supply voltage VCC and generated by the internal voltage generator 8 of FIG. 1.

The replica circuit 303 includes a P-type transistor 305 and an N-type transistor 306 serving as replica transistors. A source and a substrate (a body) of the P-type transistor 305 are commonly connected to the node N1. A drain of the P-type transistor 305 is connected to a drain of the N-type transistor 306. A source of the N-type transistor 306 is connected to the standard voltage (a ground potential, for example) VSS. That is, the P-type transistor 305 and the N-type transistor 306 are connected in series between the node N1 and the standard voltage VSS.

The P-type transistor 305 of the replica circuit 303 is smaller in size than the P-type transistor 201 of the discharge circuit 200 and equal in threshold voltage to the P-type transistor 201. Furthermore, a gate of the P-type transistor 305 and the gate of the P-type transistor 201 are commonly connected to the gate node GN. Therefore, the P-type transistor 305 can determine the voltage of the gate node GN by causing a current lower than that of the P-type transistor 201 to flow across the P-type transistor 305. For example, by making the size (channel width) of the P-type transistor 305 one-thousandth as small as that of the P-type transistor 201 and thereby flowing a current one-thousandth as low as that flowing across the P-type transistor 201, the P-type transistor 305 can determine the voltage of the gate node NG. In this way, the replica circuit 300 functions as a replica having a size reduced from that of the discharge circuit 200.

As described above, the voltage of the node N1 is set equal to the internal power supply voltage VDC by the setting of the reference voltage V_REFSA. The replica circuit 303 can set the voltage of the gate node GN to the voltage (VDC-Vtp) obtained by subtracting the threshold voltage Vtp of the P-type transistor 305 from the internal power supply voltage VDC while causing the current Icnst far lower than the current Iclamp flowing across the discharge circuit 200 to flow across the replica circuit 303. In this way, the gate voltage generator 300 can set the voltage of the gate node GN to a desired voltage (VDC-Vtp) using the current Icnst far lower than the current Iclamp flowing across the discharge circuit 200.

The N-type transistor 306 is a switching transistor that is turned on when the internal power supply voltage VDC is supplied to the power supply wire 110. The N-type transistor 306 is not necessarily always turned on when the internal power supply voltage VDC is supplied to the power supply wire 110 but the N-type transistor 306 can be turned on only when clamping the power supply wire 110. A capacitor CAP is provided to stabilize the voltage of the gate node GN.

Figure 5:
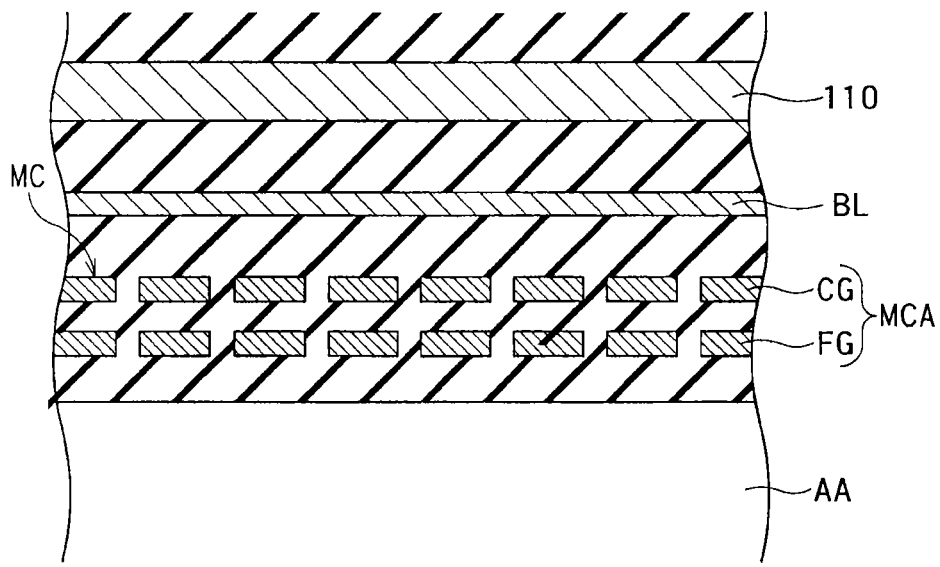
FIG. 5 is a cross-sectional view showing an example of an arrangement relation among the memory cell array MCA, the power supply wire 110, and the bit line BL.

Operations performed by the power supply circuit 100, the discharge circuit 200, and the gate voltage generator 300 are described next. The power supply circuit 100 drops the external power supply voltage VCC using the reference voltage Vref and generates the internal power supply voltage VDC. The power supply wire 110 extends above the memory cell array 1 and is connected to the sense amplifier circuit SA as described with reference to FIG. 3. Accordingly, the power supply wire 110 is sometimes influenced by a voltage of the bit line BL present below the power supply wire 110. That is, the voltage of the power supply wire 110 possibly fluctuates by capacitive coupling between the power supply wire 110 and the bit line BL. For example, FIG. 5 is a cross-sectional view showing an example of an arrangement relation among the memory cell array MCA, the power supply wire 110, and the bit line BL. For the sake of convenience, the memory cell array 1 is denoted by MCA in or referring to FIG. 5. The memory cells MC are formed on an active area AA (a semiconductor substrate). Reference character FG denotes a flowing gate and CG denotes a control gate. The bit line BL is provided above the memory cell array MCA. The power supply wire 110 is provided above the bit line BL. The bit line BL is sometimes located just under the power supply wire 110 as shown in FIG. 5. In this case, the voltage of the power supply wire 110 possibly greatly fluctuates depending on the voltage of the bit line BL because the capacitive coupling between the power supply wire 110 and the bit line BL is quite large.

In the NAND flash memory, the voltage of the bit line BL sometimes rises up to be a voltage (tens of volts, for example) far higher than the internal power supply voltage VDC during an erasing operation. In this case, the voltage of the power supply wire 110 also rises to be far higher than the internal power supply voltage VDC by the capacitive coupling between the power supply wire 110 and the bit line BL.

When the discharge circuit 200 is not provided, a forward bias is applied to the P-type transistor 102 when the voltage of the power supply wire 110 becomes far higher than the internal power supply voltage VDC and further exceeds the external power supply voltage VCC. Such a forward bias breaks the P-type transistor 102 and causes the power supply circuit 100 to fail. Alternatively, an erasure voltage sometimes does not rise up to a desired voltage level and the erasing operation cannot be performed when the forward bias flows to the P-type transistor 102.

Meanwhile, according to the first embodiment, the discharge circuit 200 is connected to the power supply wire 110. Furthermore, the gate voltage generator 300 sets the voltage of the gate node GN of the discharge circuit 200 to a voltage (VDC-Vtp) obtained by subtracting the threshold voltage Vtp of the P-type transistor 201 from the internal power supply voltage VDC. With this configuration, when the voltage of the power supply wire 110 exceeds the internal power supply voltage VDC, the P-type transistor 201 of the discharge circuit 200 is turned on and the P-type transistor 201 instantaneously and automatically discharges the current (charge)

Iclamp from the power supply wire 110 to the standard voltage VSS (ground). That is, when the voltage of the power supply wire 110 exceeds the internal power supply voltage VDC, the discharge circuit 200 automatically operates and instantaneously discharges the charge from the power supply wire 110. As compared with the following second embodiment, the first embodiment is characterized by a higher starting speed of a discharge operation because of no delay in an operational amplifier 402.

On the other hand, when the voltage of the power supply wire 110 does not exceed the internal power supply voltage VDC, the P-type transistor 201 of the discharge circuit 200 is kept to be turned off and does not discharge the current (charge) from the power supply wire 110. That is, the discharge circuit 200 does not operate when the voltage of the power supply wire 110 does not exceed the internal power supply voltage VDC. Therefore, the voltage of the power supply wire 110 is kept as it is. In this way, the discharge circuit 200 can control the power supply wire 110 so that the voltage of the power supply wire 110 does not exceed the internal power supply voltage VDC. The constant current Icnst does not flow across the power supply wire 110 according to the first embodiment when the voltage of the power supply wire 110 does not exceed the internal power supply voltage VDC. Accordingly, the first embodiment is lower than the following third embodiment in current consumption.

The voltage of the power supply wire 110 during the discharge operation performed by the discharge circuit 200 is set by the voltage of the gate node GN. As described above, the voltage of the gate node GN can be changed by changing the reference voltage V_REFSA of the gate voltage generator 300. That is, it is possible to change the voltage of the power supply wire 110 during the discharge operation performed by the discharge circuit 200 by changing the setting of the reference voltage V_REFSA of the gate voltage generator 300.

The influence of noise is considered next.

For example, to reduce an area of a pericenter 51, it is considered to provide power supply wires (not shown) for transferring the external power supply voltage VCC above the memory cell arrays MCA in place of the power supply wires 110 for transferring the internal power supply voltage VDC. That is, it is considered to arrange the power supply wires for the external power supply voltage VCC provided in the pericenter 51, above the memory cell arrays MCA. In this case, the area of the pericenter 51 can be reduced. However, the external power supply voltage VCC is not synchronized with internal operations performed by the NAND chip 10 and propagates noise irrelevant to the internal operation. Accordingly, it is difficult to predict noise from the external power supply voltage VCC by a simulation or the like. Therefore, when the power supply wires for the external power supply voltage VCC are provided above the memory cell arrays MCA, noise from the external power supply voltage VCC may possibly exert an unpredictable adverse effect on the bit lines BL and/or the memory cells MC. For example, the probability increases that the sense amplifier circuits SA erroneously detect data. Therefore, in this case, the reliability of the detected data degrades although the area of the pericenter 51 can be reduced.

In contrast, according to the first embodiment, the power supply wires 110 for transferring the internal power supply voltage VDC are arranged above the memory cell arrays MCA. The internal power supply voltage VDC is a power supply voltage generated within the NAND chip 10 and synchronized with operations performed by the sense amplifier circuits SA. Therefore, it is possible to highly accurately predict the noise from the internal power supply voltage VDC by a simulation. This can facilitate designing the NAND chip 10 in light of the influence of noise from the internal power supply voltage VDC.

Furthermore, in a semiconductor storage device such as the NAND flash memory, the power supply wires for supplying the external power supply voltage VCC from the external power supply pads PAD to the power supply circuit 100 are formed to be wide in the pericenter 51 between the adjacent memory cell arrays MCA so as not to drop the external power supply voltage VCC. Accordingly, a wide space for providing the power supply wires is required between the adjacent memory cell arrays MCA. However, such a wide space obstructs downscaling of a memory chip.

In contrast, according to the first embodiment, the power supply wires 110 for the internal power supply voltage VDC are provided above the memory cell arrays MCA. Accordingly, it is unnecessary to provide the power supply wires for the external power supply voltage VCC in the pericenter 51 and to provide the power supply wires for the external power supply voltage VCC above the memory cell arrays MCA. This makes it possible for the pericenter 51 to be narrow because of no need to provide the power supply wires for the external power supply voltage VCC in the pericenter 51. As a result, the memory chip can be downscaled. Moreover, the NAND chip 10 is less influenced by unpredictable power supply noise because of no need to provide the power supply wires for the external power supply voltage VCC above the memory cell arrays MCA. This can ensure that the NAND chip 10 operates stably. That is, the NAND chip 10 according to the first embodiment can realize a reduced chip size while suppressing the influence of the power supply noise and ensuring high reliability of the detected data.

In the first embodiment, one discharge circuit 200 and one gate voltage generator 300 can be provided commonly to a plurality of power supply circuits 100 and a plurality of power supply wires 110. For example, when the power supply circuits 100 and the power supply wires 110 supply the same internal power supply voltage VDC, it is possible to use one discharge circuit 200 and one gate voltage generator 300 common to the power supply circuits 100 and the power supply wires 110. This can further downscale the NAND chip 10.

(Second Embodiment)

Figure 6:
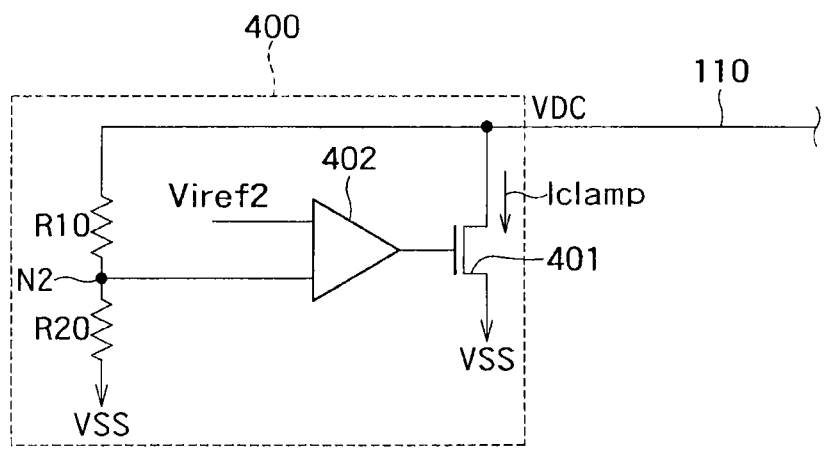
FIG. 6 is a circuit diagram showing an example of a configuration of a discharge circuit 400 according to the second embodiment.

FIG. 6 is a circuit diagram showing an example of a configuration of a discharge circuit 400 according to the second embodiment. The second embodiment differs from the first embodiment in that the discharge circuit 400 replaces the discharge circuit 200 and the gate voltage generator 300. Other configurations of the second embodiment can be identical to corresponding configurations of the first embodiment. The power supply circuit 100 is connected to the power supply wire 110 in the second embodiment similarly to the first embodiment shown in FIG. 4 although it is not shown in FIG. 6.

The discharge circuit 400 includes an N-type transistor 401, an operational amplifier 402, and resistors R10 and R20. The N-type transistor 401 is connected between the power supply wire 110 and the standard voltage VSS (ground voltage, for example). A gate of the N-type transistor 401 is connected to an output of the operational amplifier 402.

One of two inputs of the operational amplifier 402 is connected to a reference voltage Vref2. The other input of the operational amplifier 402 is connected to a node N2 between the resistors R10 and R20.

The resistors R10 and R20 are connected in series between the power supply wire 110 and the standard voltage VSS.

A voltage of the node N2 of the power supply wire 110 is resistance-divided by the resistors R10 and R20 and the resultant voltage is input to the operational amplifier 402. The operational amplifier 402 controls the N-type transistor 401 so that the voltage of the node N2 is equal to the reference voltage Vref2.

For example, in a case of setting the voltage of the power supply wire 110 to the internal power supply voltage VDC, it suffices to set the reference voltage Vref2 to VDC (R20/(R10+R20)). In this case, when the voltage of the power supply wire 110 exceeds the internal power supply voltage VDC, the operational amplifier 402 turns on the N-type transistor 401 and automatically discharges the current (charge) Iclamp from the power supply wire 110 to the standard voltage VSS (ground) via the N-type transistor 401.

On the other hand, when the voltage of the power supply wire 110 does not exceed the internal power supply voltage VDC, the operational amplifier 402 keeps the N-type transistor 401 to be turned off and does not discharge the current (charge) from the power supply wire 110. That is, the discharge circuit 400 does not operate when the voltage of the power supply wire 110 does not exceed the internal power supply voltage VDC. Therefore, the voltage of the power supply wire 110 is kept as it is. In this way, the discharge circuit 400 can control the power supply wire 110 so that the voltage of the power supply wire 110 does not exceed the internal power supply voltage VDC. Accordingly, the discharge circuit 400 according to the second embodiment can exert similar effects as those of the discharge circuit 200 according to the first embodiment.

According to the second embodiment, it is possible to suppress current consumption as compared with the first embodiment because the current Icnst does not flow differently from the gate voltage generator 300 in the first embodiment.

Furthermore, a feedback control is executed while using the operational amplifier 402. Accordingly, as the voltage of the power supply wire 110 rises higher than the internal power supply voltage VDC, the operational amplifier 402 discharges the higher current via the N-type transistor 401. Therefore, according to the second embodiment, even when the voltage of the power supply wire 110 is far higher than the internal power supply voltage VDC, it is possible to deal with the problem by discharging a relatively high current.

(Third Embodiment)

Figure 7:
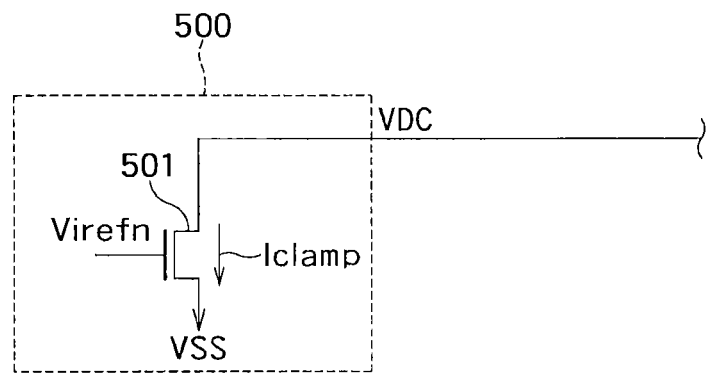
FIG. 7 is a circuit diagram showing an example of a configuration of a discharge circuit 500 according to the third embodiment.

FIG. 7 is a circuit diagram showing an example of a configuration of a discharge circuit 500 according to the third embodiment. The third embodiment differs from the first embodiment in that the discharge circuit 500 replaces the discharge circuit 200 and the gate voltage generator 300. Other configurations of the third embodiment can be identical to corresponding configurations of the first embodiment. Therefore, in the third embodiment, the power supply circuit 100 is similarly connected to the power supply wire 110 as shown in FIG. 4 although it is not shown in FIG. 7.

The discharge circuit 500 includes an N-type transistor 501. The N-type transistor 501 is connected between the power supply wire 110 and the standard voltage VSS (ground voltage, for example). The reference voltage Virefn is applied to a gate of the N-type transistor 501. As described above, the reference voltage Virefn is the voltage applied so as to flow the constant current Icnst. That is, the constant current Icnst flows across the discharge circuit 500 from the power supply wire 110 so as to keep the voltage of the power supply wire 110 equal to the internal power supply voltage VDC.

For example, when the voltage of the power supply wire 110 exceeds the internal power supply voltage VDC, the N-type transistor 501 instantaneously and automatically discharges the current (charge) Iclamp from the power supply wire 110 to the standard voltage VSS (ground).

On the other hand, when the voltage of the power supply wire 110 does not exceed the internal power supply voltage VDC, the current from the power supply circuit 100 flows across the N-type transistor 501 via the power supply wire 110. The discharge circuit 500 can thereby control the power supply wire 110 so that the voltage of the power supply wire 110 does not exceed the internal power supply voltage VDC. Accordingly, the discharge circuit 500 according to the third embodiment can exert similar effects as those of the discharge circuit 200 according to the first embodiment.

The discharge circuit 500 according to the third embodiment is smaller in circuit scale than the discharge circuits 200 and 400 according to the first and second embodiments. Therefore, the memory according to the third embodiment is more suitable for downscaling than the first and second embodiments.

In the above embodiments, the word of "connected" is not limited to "directly connected", but it also includes "electrically connected".

A memory cell array formation may be disclosed in U.S. patent application Ser. No. 12/407,403 filed on Mar. 19, 2009. U.S. patent application Ser. No. 12/407,403, the entire contents of which are incorporated by reference herein.

Furthermore, a memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore, a memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore, a memory cell array formation may be disclosed in U.S. patent application Ser. No. 12/532,030 filed on Mar. 23, 2009. U.S. patent application Ser. No. 12/532,030, the entire contents of which are incorporated by reference herein.

In the first to third embodiments, the page unit is defined as the range of the memory cells MC along one word line WL and the block unit is defined as the range of the NAND cell units 4 aligned in the word line WL direction. However, these embodiments are not limited to the definitions. For example, when a plurality of sub-blocks are present in one block and each sub-block is constituted by a plurality of so-called strings, a plurality of memory cells MC included in a certain sub-block among the memory cells MC commonly connected to one word line WL can be defined as a page unit and the sub-blocks can be defined as an erasing unit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a memory cell array comprising a plurality of memory cells;

a plurality of word lines electrically connected to control gates of the memory cells;

a plurality of bit lines electrically connected to one end of a current path of the memory cells;

a sense amplifier part configured to detect data stored in the selected memory cells;

a power supply part configured to convert an external power supply voltage to an internal power supply voltage and to supply the internal power supply voltage to the sense amplifier part, the memory cell array being disposed between the sense amplifier and the power supply part;

a power supply wire extending above a first area in the memory cell array, the first area being between the power supply part and the sense amplifier part; and a discharge part electrically connected to the power supply wire and configured to discharge the power supply wire when a voltage of the power supply wire exceeds a first voltage.

2. The device of claim 1, wherein the first voltage is the internal power supply voltage.

3. The device of claim 1, wherein the discharge part comprises a clamp transistor provided between the power supply wire and a second voltage, and a gate voltage of a gate of the clamp-type transistor is capable of setting to a third voltage.

4. The device of claim 2, wherein the discharge part comprises a clamp transistor provided between the power supply wire and a second voltage, and a gate voltage of a gate of the clamp-type transistor is capable of setting to a third voltage.

5. The device of claim 3, wherein the gate voltage of the clamp transistor is capable of setting to a voltage obtained by subtracting a threshold voltage of the clamp transistor from the internal power supply voltage.

6. The device of claim 4, wherein the gate voltage of the clamp transistor is capable of setting to a voltage obtained by subtracting a threshold voltage of the clamp transistor from the internal power supply voltage.

7. The device of claim 5, further comprising a gate voltage generator comprising a first transistor smaller in a size than the clamp transistor, the first transistor being substantially equal in a threshold voltage to the clamp transistor, and the gate voltage generator configured to generate a gate voltage of the clamp transistor using the first transistor.

8. The device of claim 6, further comprising a gate voltage generator comprising a first transistor smaller in a size than the clamp transistor, the first transistor being substantially equal in a threshold voltage to the clamp transistor, and the gate voltage generator configured to generate a gate voltage of the clamp transistor using the first transistor.

9. The device of claim 1, wherein the discharge part is commonly provided to a plurality of the power supply wires or a plurality of the power supply parts.

10. The device of claim 2, wherein the discharge part is commonly provided to a plurality of the power supply wires or a plurality of the power supply parts.

11. A semiconductor storage device comprising:

a memory cell array comprising a plurality of memory cells;

a plurality of word lines electrically connected to control gates of the memory cells;

a plurality of bit lines electrically connected to one end of a current path of the memory cells;

a sense amplifier part configured to detect data stored in the selected memory cells;

a power supply part configured to convert an external power supply voltage to an internal power supply voltage and to supply the internal power supply voltage to the sense amplifier part, the memory cell array being disposed between the sense amplifier and the power supply part;

a power supply wire extending above a first area in the memory cell array, the first area being between the power supply part and the sense amplifier part; and a discharge part electrically connected to the power supply wire and configured to discharge the power supply wire when a voltage of the power supply wire exceeds a first voltage.

12. The device of claim 11, wherein the power supply wire extends above the memory cell array.

13. The device of claim 11, wherein the first voltage is the internal power supply voltage.

14. The device of claim 11, wherein the discharge part comprises a clamp transistor provided between the power supply wire and a second voltage, and a gate voltage of a gate of the clamp-type transistor is capable of setting to a third voltage.

15. The device of claim 14, wherein the gate voltage of the clamp transistor is capable of setting to a voltage obtained by subtracting a threshold voltage of the clamp transistor from the internal power supply voltage.

16. The device of claim 14, further comprising a gate voltage generator comprising a first transistor smaller in a size than the clamp transistor, the first transistor being substantially equal in a threshold voltage to the clamp transistor, and the gate voltage generator configured to generate a gate voltage of the clamp transistor using the first transistor.

17. The device of claim 15, further comprising a gate voltage generator comprising a first transistor smaller in a size than the clamp transistor, the first transistor being substantially equal in a threshold voltage to the clamp transistor, and the gate voltage generator configured to generate a gate voltage of the clamp transistor using the first transistor.

18. The device of claim 11, wherein the discharge part is commonly provided to a plurality of the power supply wires or a plurality of the power supply parts.

* * * * *